(12) United States Patent
Miyasaka et al.

(10) Patent No.: US 8,362,508 B2
(45) Date of Patent: Jan. 29, 2013

(54) ELECTRONIC DEVICE SUBSTRATE, ELECTRONIC DEVICE, METHOD OF MANUFACTURING ELECTRONIC DEVICE SUBSTRATE, METHOD OF MANUFACTURING ELECTRONIC DEVICE, AND ELECTRONIC APPARATUS

(75) Inventors: Mitsutoshi Miyasaka, Nagano (JP); Taimei Kodaira, Chino (JP)

(73) Assignee: Seiko Epson Corporation, Tokyo (JP)

( * ) Notice: Subject to any disclaimer, the term of this patent is extended or adjusted under 35 U.S.C. 154(b) by 140 days.

(21) Appl. No.: 12/974,573

(22) Filed: Dec. 21, 2010

(65) Prior Publication Data
US 2011/0163456 A1 Jul. 7, 2011

(30) Foreign Application Priority Data
Jan. 4, 2010 (JP) ................................ 2010-000203

(51) Int. Cl.
*H01L 33/00* (2010.01)

(52) U.S. Cl. ......................................................... 257/98
(58) Field of Classification Search ............. 257/98–100
See application file for complete search history.

(56) References Cited

U.S. PATENT DOCUMENTS
2010/0117999 A1 5/2010 Matsunaga et al.

FOREIGN PATENT DOCUMENTS
JP 2008-218542 A 9/2008

*Primary Examiner* — Jenny L Wagner
(74) *Attorney, Agent, or Firm* — AdvantEdge Law Group, LLC

(57) ABSTRACT

An electronic device substrate includes a resin layer, a semiconductor layer disposed in a first region on the resin layer, a plurality of insulating films disposed in the first region on the resin layer, and connection terminals disposed in a second region on the resin layer, the connection terminals being used for connection to an external component to be connected. The connection terminals in plan view do not overlap with any insulating films composed of an inorganic material among the plurality of insulating films.

4 Claims, 15 Drawing Sheets

ELECTRONIC DEVICE SUBSTRATE, ELECTRONIC DEVICE, METHOD OF MANUFACTURING ELECTRONIC DEVICE SUBSTRATE, METHOD OF MANUFACTURING ELECTRONIC DEVICE, AND ELECTRONIC APPARATUS

CROSS-REFERENCE TO RELATED APPLICATION

This application is based on and claims priority from Japanese Patent Application No. 2010-000203, filed on Jan. 4, 2010, the contents of which are incorporated herein by reference.

BACKGROUND

1. Technical Field

The present invention relates to an electronic device substrate, an electronic device, a method of manufacturing an electronic device substrate, a method of manufacturing an electronic device, and an electronic apparatus.

2. Related Art

In general, an electronic device, such as a liquid crystal display, an EL display, or a fingerprint sensor, includes a TFT substrate having a plurality of thin-film transistors. The TFT substrate is provided with a connection terminal which connects a driver IC for driving thin-film transistors to the TFT substrate. Alternatively, the TFT substrate is provided with a driver circuit for driving thin-film transistors, and a connection terminal which connects an external component to be connected, for supplying electrical signals to the driver circuit, to the TFT substrate.

As the method for connecting a TFT substrate to an external component to be connected, such as a driver IC, a method is known in which the two are thermocompression-bonded to each other through an anisotropic conductive film, for example, as disclosed in JP-A-2008-218542. In an anisotropic conductive film, conductive particles are dispersed in a film composed of a thermosetting adhesive. When the film is subjected to thermocompression bonding in the thickness direction, the thermosetting adhesive is fluidized and the conductive particles in the film are captured and compressed between a connection terminal of a TFT substrate and a connection terminal of a driver IC. The resulting deformation is maintained by the thermoset adhesive, thus establishing electrical connection between the terminals.

Furthermore, recently, JP-A-2008-276212 has disclosed use of a flexible resin substrate as a TFT substrate in order to realize flexible electronic devices.

However, in order to form thin-film transistors, insulating films, such as an underlying protective film, a gate-insulating film, an interlayer insulating film, a planarizing film, and a top protective film, are formed on the TFT substrate. These insulating films are usually composed of an inorganic material (e.g., silicon oxide or silicon nitride). In the case where a flexible resin substrate is used as the TFT substrate and an inorganic material is used for the insulating films, since the TFT substrate and an external component to be connected are thermocompression-bonded to each other with an anisotropic conductive film therebetween, the TFT substrate is placed under the environment of high temperature (e.g., 150° C. to 200° C.) and high pressure (e.g., 2 to 5 MPa). In such a case, the flexible resin substrate is deformed due to pressure, and cracks or the like occur in the insulating films. As a result, wiring disposed on the inorganic insulating films may be disconnected, resulting in a decrease in production yield.

SUMMARY

An advantage of some aspects of the invention is to prevent a decrease in yield when a connection terminal of an electronic device substrate and an external component to be connected are connected to each other by thermocompression bonding.

According to a first aspect of the invention, an electronic device substrate includes a resin layer, a semiconductor layer disposed in a first region on the resin layer, a plurality of insulating films disposed in the first region on the resin layer, and connection terminals disposed in a second region on the resin layer, the connection terminals being used for connection to an external component to be connected. The connection terminals in plan view do not overlap with any insulating films composed of an inorganic material among the plurality of insulating films. Since no inorganic insulating films are disposed at least in a region which in plan view overlaps with the connection terminals, even if the resin layer underlying the connection terminals is deformed by pressure at the time of thermocompression bonding of the external component to be connected to the connection terminals, wiring provided on the resin layer is not damaged, and it is possible to suppress a decrease in production yield due to breakage of the inorganic insulating films. In this description, the term "resin layer" means a flexible resin substrate having rigidity to an extent that it can maintain its shape, or a film-shaped resin layer or the like formed on a substrate.

According to a second aspect of the invention, an electronic device includes the electronic device substrate according to the first aspect of the invention, and an external component to be connected which has been connected to the connection terminals through a thermosetting adhesive. According to a third aspect of the invention, an electronic apparatus includes the electronic device according to the second aspect of the invention.

According to a fourth aspect of the invention, a method of manufacturing an electronic device substrate is provided, the electronic device substrate including a resin layer, a semiconductor layer disposed in a first region on the resin layer, a plurality of insulating films disposed in the first region on the resin layer, and connection terminals disposed in a second region on the resin layer, the connection terminals being used for connection to an external component to be connected, and the method includes forming the semiconductor layer and the plurality of insulating films in the first region on the resin layer; and forming the connection terminals in the second region on the resin layer such that the connection terminals in plan view do not overlap with any insulating films composed of an inorganic material among the plurality of insulating films. Since no inorganic insulating films are disposed at least in a region which in plan view overlaps with the connection terminals, even if the resin layer underlying the connection terminal is deformed by pressure at the time of thermocompression bonding of the external component to be connected to the connection terminals, wiring provided on the resin layer is not damaged, and it is possible to suppress a decrease in production yield due to breakage of the inorganic insulating films. In this description, the term "resin layer" means a flexible resin substrate having rigidity to an extent that it can maintain its shape, or a film-shaped resin layer or the like formed on a substrate.

According to a fifth aspect of the invention, a method of manufacturing an electronic device substrate includes forming a semiconductor layer and a plurality of insulating films in a first region of a first surface of a first substrate; forming connection terminals to be connected to an external component to be connected in a second region of the first surface such that the connection terminals in plan view do not overlap with any insulating films composed of an inorganic material among the plurality of insulating films; transferring the semiconductor layer, the plurality of insulating films, and the connection terminals from the first substrate to a second substrate; and transferring the semiconductor layer, the plurality of insulating films, and the connection terminals from the second substrate to a resin layer.

According to a sixth aspect of the invention, a method of manufacturing an electronic device is provided, the electronic device including an electronic device substrate manufactured by the method of manufacturing an electronic device substrate according to the fourth or fifth aspect of the invention and an external component to be connected, and the method further includes connecting the external component to be connected to the connection terminals through a thermosetting adhesive.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described specifically with reference to the drawings. However, it is to be understood that the following embodiments are merely examples of the invention and do not limit the technical scope of the invention. In this application, the term "electronic device" refers to a display device, such as a liquid crystal display device, an electrophoretic display device, an organic electroluminescence display device, or an electrochromic display device: any of various types of sensor device, such as a capacitive sensor, an optical sensor, or a pressure sensor; a volatile or nonvolatile storage device, such as a DRAM, an SRAM, or an FeRAM; an arithmetic unit, such as a microprocessor or a digital signal processor; or a composite electronic apparatus in which two or more of these devices are combined. Furthermore, the term "electronic device substrate" refers to a substrate which is used in any of these electronic devices and which is provided with a thin-film transistor circuit disposed on a resin layer and a connection terminal.

Figure 1:
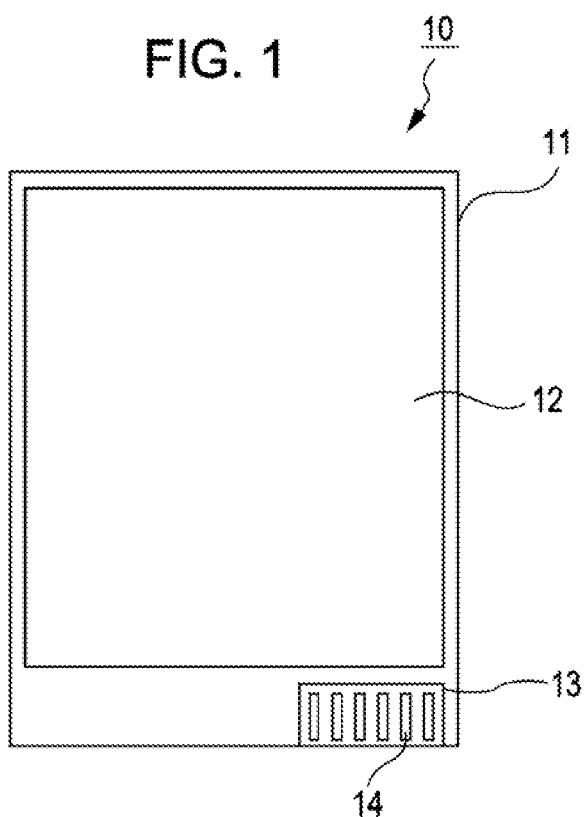
FIG. 1 is a plan view of an electronic device substrate according to an embodiment of the invention.

FIG. 1 is a plan view of an electronic device substrate 10 according to an embodiment of the invention. In accordance with this embodiment of the invention, the electronic device substrate 10 includes a flexible resin substrate as a substrate 11, and has at least a first region and a second region. In the first region, a semiconductor film, electrodes, insulating films, and the like are provided and thin-film transistors are disposed. The first region is referred to as an element section 12. In the second region, a plurality of connection terminals 14 are provided, the connection terminals 14 being used for connection to an external component to be connected (e.g., a driver IC, a flexible printed-circuit board, or the like). The second region is referred to as a connecting section 13. Electrical signals are supplied from the external component to be connected, through the connection terminals 14, to the element section 12.

A thin-film semiconductor circuit including thin-film transistors, thin-film diodes, thin-film resistors, and the like is disposed in the element section 12. For example, the thin-film semiconductor circuit may be a display device including transistors and pixel electrodes, or a sensor device including thin-film diodes and thin-film capacitors.

The transistors disposed in the element section 12 include semiconductor films, electrodes (gate electrodes, drain electrodes, and source electrodes), and insulating films (gate-insulating films, interlayer insulating films, underlying protective films, planarizing films, and the like). In the connecting section 13, inorganic insulating films are not provided. That is, the insulating films provided in the element section 12 may be all inorganic insulating films, or some of them may be organic insulating films. However, inorganic insulating films, which may be damaged at the time of thermocompression bonding of an external component to be connected to the connecting section 13 through an anisotropic conductive film containing a thermosetting adhesive or the like, are not disposed at least in a region which in plan view overlaps with the plurality of connection terminals 14. In other words, the plurality of connection terminals 14 do not overlap with any of the inorganic insulating films. In the manufacturing process of the electronic device substrate 10, inorganic insulating films may also be formed in the connecting section 13 on the substrate 11. However, the inorganic insulating films disposed at least in a region where a plurality of connection terminals 14 are to be formed are removed before the formation of the plurality of connection terminals 14. In accordance with this embodiment of the invention, since no inorganic insulating films are disposed at least in a region which in plan view overlaps with the plurality of connection terminals 14, even if the resin layer underlying the connection terminals 14 is deformed by pressure at the time of thermocompression bonding of the external component to be connected to the plurality of connection terminals 14, wiring (not shown) provided on the substrate 11 is not damaged, and it is possible to efficiently suppress a decrease in production yield.

As described above, the external component to be connected is a driver IC, a flexible printed-circuit board, or the like. The driver IC or the flexible printed-circuit board has connecting electrodes to be connected to the connection terminals 14. The highest pressure is applied to the substrate 11 in the region where the connection terminals 14 and the connecting electrodes overlap with each other with an anisotropic conductive film therebetween. Consequently, if at least the connection terminals 14 in plan view do not overlap with any of the inorganic insulating films, an advantage can be obtained in that a decrease in production yield can be suppressed.

However, there is a possibility that wiring may be damaged also in the region where the connection terminals 14 and the connecting electrodes do not overlap with each other through an anisotropic conductive film because some pressure may be applied to the substrate 11 through the anisotropic conductive film. Furthermore, there is a possibility that when an external component 60 to be connected is connected to the substrate 11, the external component 60 to be connected may overlap with the inorganic insulating films because of the margin of error in alignment, resulting in damage to wiring. Accordingly, preferably, the size of the region where inorganic insulating films are not provided is determined as described below.

Figure 2:
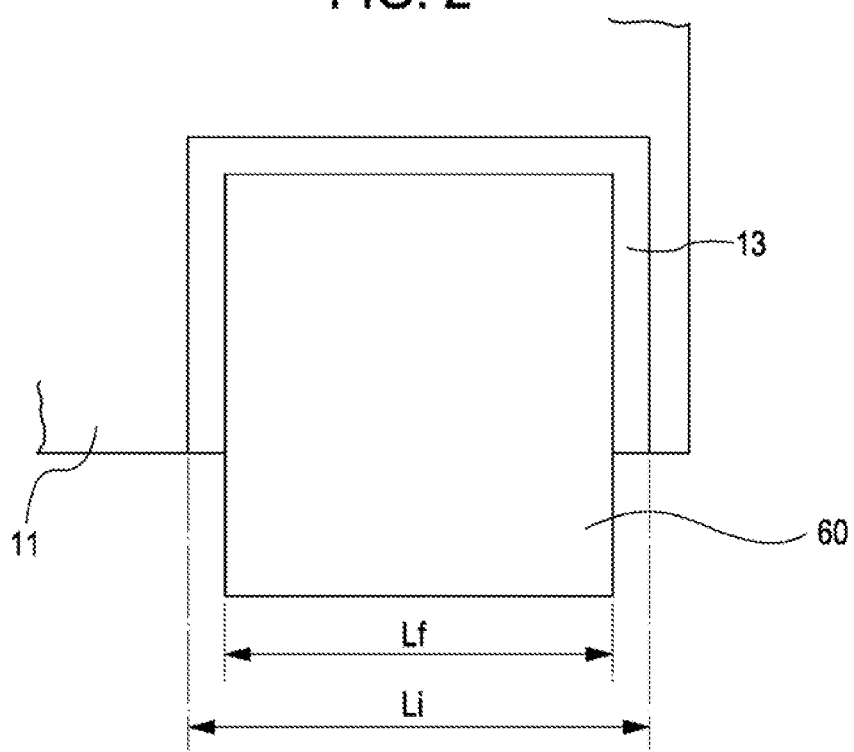
FIG. 2 is a partially omitted plan view of an electronic device substrate according to an embodiment of the invention.

FIG. 2 is a partially omitted plan view showing a state in which a flexible printed-circuit board, as an external component 60 to be connected, is mounted on an electronic device substrate 10. Preferably, the relationship 0.25 mm≦Li−Lf≦3 mm is satisfied, where Lf is the width of the external component 60 to be connected, and Li is the width of the connecting section 13. When 0.25 mm≦Li−Lf, even if the margin of error occurs in alignment at the time of mounting the external component 60 to be connected on the electronic device substrate 10, it is almost possible to prevent the external component 60 to be connected from overlapping with the inorganic insulating films. Meanwhile, adhesion between metal wiring and an organic resin layer is weaker than adhesion between metal wiring and an inorganic insulating film. Therefore, when the portion in which metal wiring is provided on the organic resin layer is long, the metal wiring is easily separated from the organic resin layer. In order to prevent metal wiring from being easily separated, preferably, Li−Lf≦3 mm. In the second region where inorganic insulating films are not provided, in a transfer method, which will be described later in a first embodiment, there is a situation in which a temporary adhesive 31 is exposed during the manufacturing process (refer to FIG. 7B). Furthermore, in a direct formation method, which will be described later in a second embodiment, there are steps in which an organic resin layer is exposed (e.g., refer to FIGS. 9B, 11A, 11B, and 12A). Under such a situation, the following problems may occur. For example, in the case of the transfer method, the temporary adhesive may degrade in an exposed state, or in the direct formation method, the resin may be etched or may swell, expand, or contract. In order to overcome such problems, the second region is desirably as small as possible, and the relationship Li−Lf≦3 mm is empirically set.

In addition, transistor elements constituting the element section 12 of the electronic device substrate 10 may be either bottom gate type or top gate type.

First Embodiment

A method of manufacturing an electronic device substrate 101 using a transfer method, and a method of connecting an external component to be connected to the electronic device substrate 101 according to a first embodiment of the invention will be described with reference to FIGS. 3A to 8B, which are each a cross-sectional view of an electronic device substrate, in which the left side shows a first region 12 where thin-film elements are formed, and the right side shows a second region 13 where connection terminals are formed. In the first embodiment, a display device having pixel electrodes is described as an example of the electronic device.

Figure 3A:
FIGS. 3A to 3C are each a cross-sectional view showing a manufacturing process of an electronic device substrate according to a first embodiment of the invention.

First, as shown in FIG. 3A, a release layer 21 and an underlying protective film 22 are formed on a first substrate 20. The surface of the first substrate 20 on which the release layer 21 and the underlying protective film 22 are formed is defined as a front surface of the first substrate 20. As the first substrate 20, a light-transmissive substrate, such as a glass substrate or a quartz substrate, is used. The first substrate 20 is required to have moderate mechanical strength and heat resistance that can endure the processing temperature. For example, it is preferable to use a first substrate 20 having a strain point (glass transition temperature Tg or softening point) equal to or higher than the maximum processing temperature Tmax. In order to use a low-temperature polysilicon semiconductor for the semiconductor layer of a thin-film transistor, the strain point is preferably 350° C. or higher, more preferably 500° C. or higher.

The release layer 21 has a property that causes separation in the release layer 21 or at the interface between the release layer 21 and another thin film (hereinafter referred to as "intra-layer separation" or "interfacial separation") when applied with energy. Preferably, the release layer 21 has a property in which the interatomic or intermolecular bonding force in the components of the release layer 21 is lost or diminishes when irradiated with light, i.e., ablation occurs, resulting in intra-layer separation or interfacial separation. In some cases, when the release layer 21 is irradiated with light, gas may be released from the release layer 21, thus achieving the separating effect. That is, there is a case where a component contained in the release layer 21 is evaporated and released, and there is a case where the release layer 21 absorbs light and turns into gas instantly, and the vapor thereof is released, thus contributing to separation. The release layer 21 can be formed using a known material, such as amorphous silicon, hydrogen-containing amorphous silicon, nitrogen-containing amorphous silicon, a hydrogen-containing alloy, or a nitrogen-containing alloy.

As the underlying protective film 22, for example, an inorganic insulating film, such as a silicon nitride film or a silicon oxide film, can be used. As the method for forming the underlying protective film 22, a known thin film process, such as plasma CVD or sputtering, can be employed.

Figure 3B:
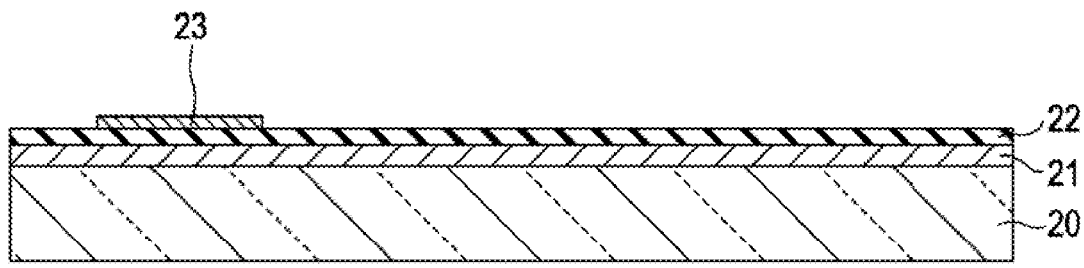
Figure 3C:
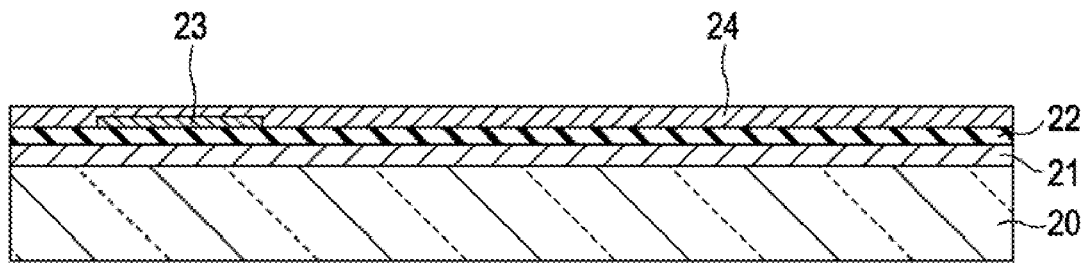

Next, as shown in FIG. 3B, using a known thin film process, such as plasma CVD, reduced pressure CVD, or sputtering, a non-doped semiconductor layer 23 is formed in an island shape on the underlying protective film 22. Next, as shown in FIG. 3C, a gate-insulating film 24 is formed over the entire surface of the substrate including the surface of the semiconductor layer 23. As the gate-insulating film 24, for example, an inorganic insulating film, such as a silicon nitride film or a silicon oxide film, can be used.

Figure 4A:
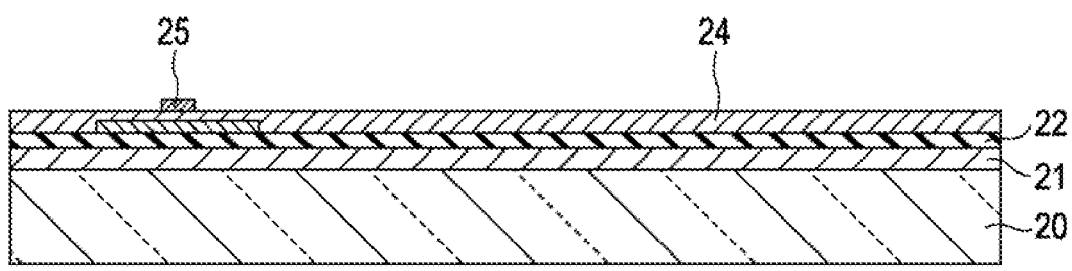
FIGS. 4A and 4B are each a cross-sectional view showing a manufacturing process of an electronic device substrate according to the first embodiment.

Next, as shown in FIG. 4A, a gate electrode 25 is formed on the gate-insulating film 24, and by ion-implanting low-concentration impurities to the semiconductor layer 23, using the gate electrode 25 as a mask, low-concentration source/drain regions are formed in the semiconductor layer 23.

Figure 4B:
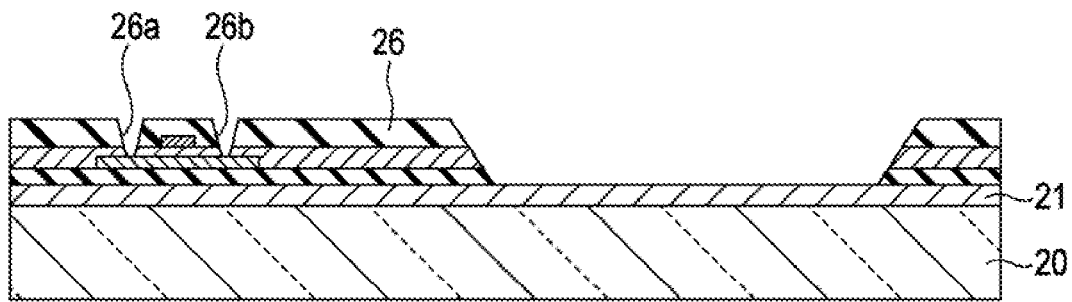

Next, as shown in FIG. 4B, an interlayer insulating film 26 is deposited, and contact holes 26a and 26b are formed at positions where a source electrode and a drain electrode are to be formed. As the interlayer insulating film 26, for example, an inorganic insulating film, such as a silicon nitride film or a silicon oxide film, can be used. At the time of forming the contact holes, at the same time, the underlying protective film 22, the gate-insulating film 24, and the interlayer insulating film 26 disposed in a region where connection terminals 14 (shown in FIG. 5A) are to be formed are removed to expose the release layer 21. By this process, all the inorganic insulating films are removed from the region where the connection terminals 14 are to be formed. In such a manner, by removing the inorganic insulating films from the region where the connection terminals 14 are to be formed and forming the contact holes 26a and 26b at one time simultaneously, it is possible to prevent an increase in the manufacturing process.

When the underlying protective film 22, the gate-insulating film 24, and the interlayer insulating film 26 are removed, the ends of the insulating films are desirably machined so as to have a gently inclined shape at an obtuse angle with respect to the substrate 20. The obtuse, inclined shape refers to the state in which the opening side angle of the inclined plane of the insulating film with respect to the substrate is about 135° or more (the insulating film side angle is 45° or less). The reason for this is that if the ends of the insulating films are steep at an angle of about 90°, there is a possibility that wiring (i.e. metal wiring constituting the connection terminals 14) provided so as to extend over the ends of the insulating films may be disconnected. However, if the ends are gentle, the possibility of disconnection will be reduced. In order to further prevent disconnection, preferably, the thickness of the metal layer constituting the connection terminals 14 is larger than the total thickness of the inorganic insulating films (in this embodiment, the total of the thickness of the underlying protective film 22, the thickness of the gate-insulating film 24, and the thickness of the inorganic interlayer insulating film 26). Furthermore, in this embodiment, an example has been described in which after inorganic insulating films are stacked in the region where connection terminals 14 are to be formed, all the inorganic insulating films are removed. However, it may be possible to form inorganic insulating films, by a vapor deposition method using a mask, or the like, so as to avoid the region where connection terminals 14 are to be formed. In short, any of the inorganic insulating films should not be disposed in the region where at least connection terminals 14 are to be formed.

Figure 5A:
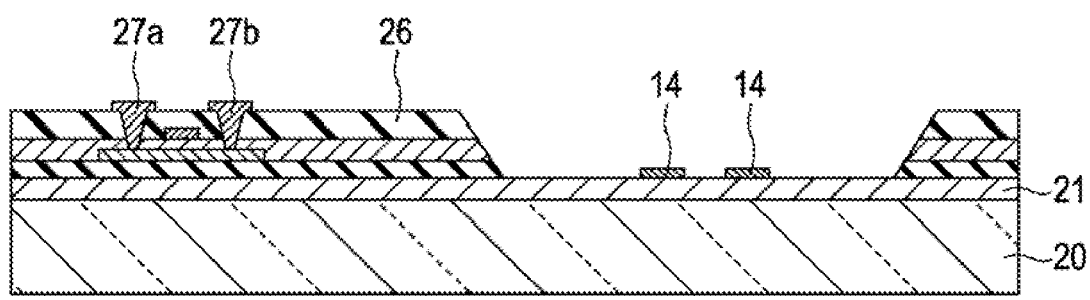
FIGS. 5A and 5B are each a cross-sectional view showing a manufacturing process of an electronic device substrate according to the first embodiment.

Next, as shown in FIG. 5A, a low-resistance conductive film is deposited using a thin film process, such as sputtering. By patterning the low-resistance conductive film to a predetermined shape, a source electrode 27a and a drain electrode 27b that are connected to the source region and the drain region of the semiconductor layer 23 through the contact holes 26a and 26b, respectively, are formed. In this process, by patterning the conductive film deposited in the region where connection terminals 14 are to be formed, the connection terminals 14 are formed. By performing formation of the source electrode 27a and the drain electrode 27b and formation of the connection terminals 14 at one time simultaneously, it is possible to suppress an increase in the manufacturing process.

Figure 5B:
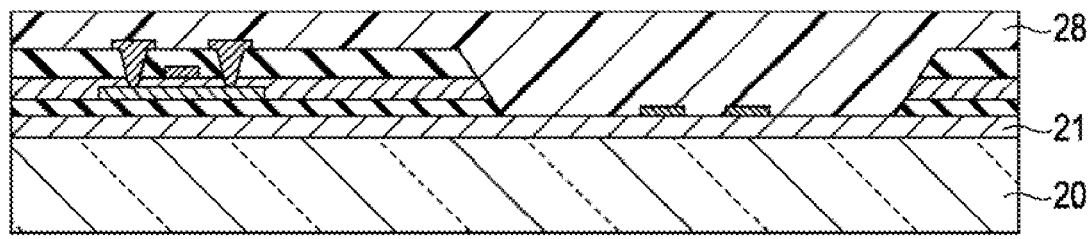

Next, as shown in FIG. 5B, a planarizing film 28 is deposited over the entire surface of the substrate. The planarizing film 28 may be an organic insulating film or an inorganic insulating film. Furthermore, the planarizing film 28 is not absolutely necessary and may be omitted. Examples of the material for the organic insulating film include polystyrene; polyimide; polyamide-imide; polyvinyl phenylene; polycarbonate; acrylic resins, such as polymethyl methacrylate; fluorocarbon resins, such as polytetrafluoroethylene, phenolic resins, such as polyvinyl phenol and novolac resins; and olefin resins, such as polyethylene, polypropylene, polyisobutylene, and polybutene. These may be used alone or in combination of two or more.

Figure 6A:
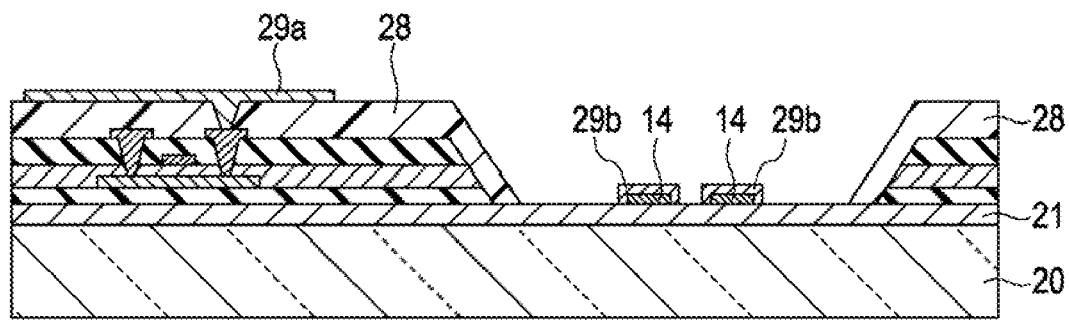
FIGS. 6A and 6B are each a cross-sectional view showing a manufacturing process of an electronic device substrate according to the first embodiment.

Next, as shown in FIG. 6A, a contact hole connecting to the drain electrode 27b is formed in the planarizing film 28, and the planarizing film 28 located in the region provided with the connection terminals 14 is removed, thereby exposing the connection terminals 14 and the release layer 21 at the surface. Then, a transparent electrode material is deposited over the entire surface of the substrate, and by patterning the resulting film into a predetermined shape, a pixel electrode 29a connecting to the drain electrode 27b is formed. Preferably, the exposed surface of the connection terminals 14 is covered with a transparent electrode material 29b so that the connection terminals 14 are protected. In this case, although the metal constituting the connection terminals 14 is not exposed, the connection terminals 14 conduct electricity through the transparent electrode material 29b, which means that the connection terminals 14 are electrically exposed at the surface. It is not always necessary to cover the entire surface of the connection terminals 14 with the transparent electrode material 29b, and by providing the transparent electrode material 29b so as to cover at least the ends of the connection terminals 14, the connection terminals 14 can be prevented from being separated. As the transparent electrode material, ITO or the like is suitably used. Here, since the display device is described as an example of the electronic device, the pixel electrode is provided. However, in an electronic device which does not require a pixel electrode, such as a storage device or an arithmetic unit, this process step is of course omitted. In the case where stacked wiring is required in an arithmetic unit or the like, deposition of the insulating film shown in FIG. 5B, formation of the contact hole and removal of the insulating film from the connecting section shown in FIG. 6A, and formation of metal wiring are repeated a plurality of times. In such a case, the metal wiring constituting the connection terminals 14 is not necessarily composed of the same metal as that of the source electrode 27a or the drain electrode 27b, and one layer or a plurality of layers constituting the stacked wiring are used. In any case, in the connecting section 13, the connection terminals 14 are formed directly on the release layer 21, and terminals thereof are electrically exposed at the surface.

Figure 6B:
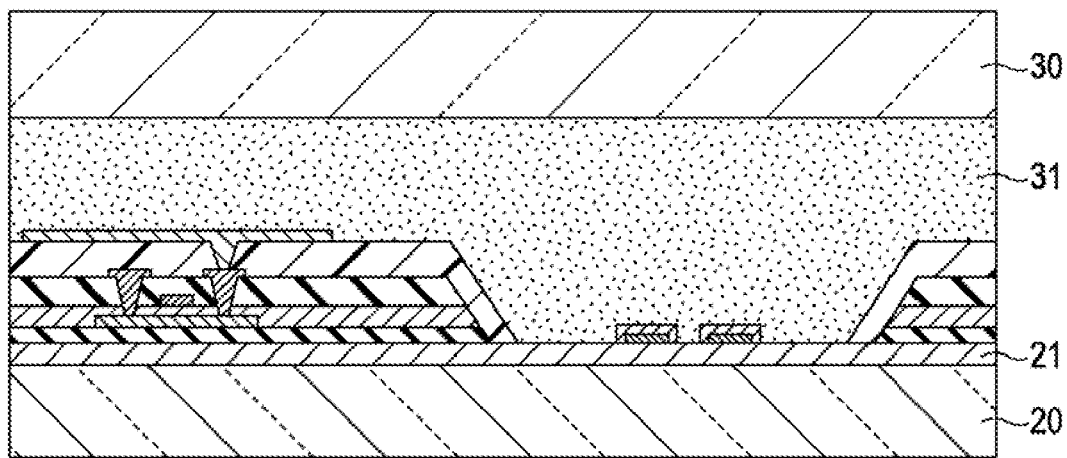

Next, as shown in FIG. 6B, using a temporary adhesive 31, the front surface of the first substrate 20 is bonded to a second substrate 30, and the first substrate 20 is irradiated with light from the back surface side thereof. The second substrate 30 may be inferior in heat resistance and corrosion resistance to the first substrate 20. The second substrate 30 must have properties (in particular, heat resistance) that can endure the transfer process, which will be subsequently performed.

As the temporary adhesive 31, any of various curable adhesives, such as a reactive curing adhesive, a thermosetting adhesive, a photo-curable adhesive (ultraviolet curable adhesive or the like), or an anaerobic adhesive, can be used. Specific examples thereof include acrylic adhesives, epoxy adhesives, silicone adhesives, natural rubber adhesives, polyurethane adhesives, phenolic adhesives, vinyl acetate adhesives, cyanoacrylate adhesives, polyvinyl alcohol adhesives, polyimide adhesives, and polyamide adhesives.

By irradiating the first substrate 20 with light from the back surface side, adhesion of the release layer 21 is weakened. When the release layer 21 is irradiated with light, intra-layer separation or interfacial separation occurs. The principle of the occurrence of intra-layer separation or interfacial separation is in that separation is caused by occurrence of ablation in the components of the release layer 21, release of gas contained in the release layer 21, and phase changes, such as melting and transpiration, that take place immediately after irradiation. The term "ablation" refers to the fact that the components of the release layer 21 which has absorbed irradiation light are photochemically or thermally excited, and bonding between atoms or molecules on the surface or inside the layer are broken and released, resulting in a phase change phenomenon in which all or part of the components of the release layer 21 is melted, transpired (evaporated), or the like. Furthermore, the phase changes may form micro bubbles, resulting in a decrease in bonding force. Whether the release layer 21 undergoes intra-layer separation, interfacial separation, or both depends on the composition of the release layer 21 and various other factors, examples of which include conditions, such as the type, wavelength, intensity, and penetration depth, of light that is irradiated.

Light that is applied to the release layer 21 is not particularly limited as long as it causes intra-layer separation or interfacial separation in the release layer 21. Examples of the light include X-rays, ultraviolet rays, visible light, infrared rays (heat rays), laser light, millimeter waves, microwaves, electron beams, and radiation ($\alpha$ rays, $\beta$ rays, and $\gamma$ rays). In particular, laser light is preferable from the standpoint that it easily causes separation (ablation) in the release layer 21 and it enables local irradiation with high accuracy. Laser light is coherent light, and is suitable for causing separation at a desired portion with high accuracy by irradiating the release layer 21 with high-power pulsed light through the first substrate 20. Consequently, by using laser light, the release layer 21 can be easily and reliably separated.

Figure 7A:
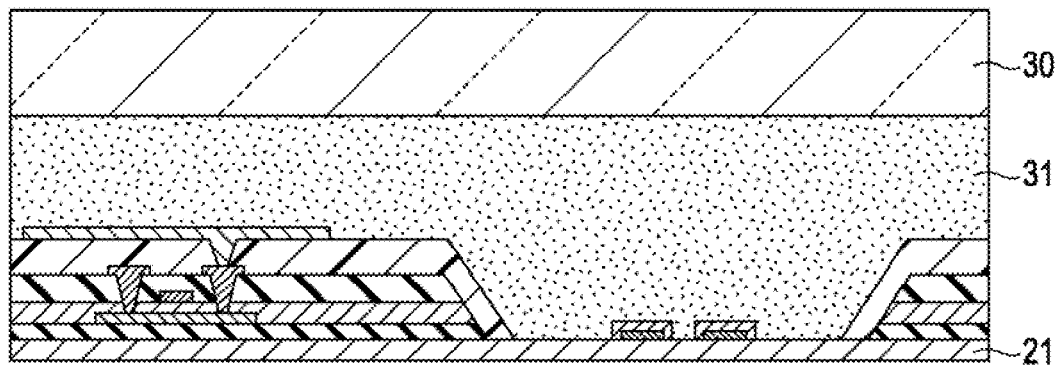
FIGS. 7A and 7B are each a cross-sectional view showing a manufacturing process of an electronic device substrate according to the first embodiment.
Figure 7B:
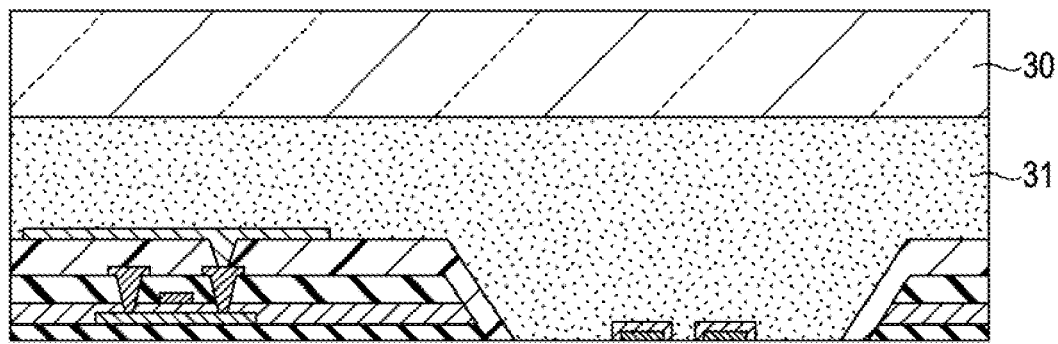

Next, as shown in FIG. 7A, after the bonding force of the release layer 21 is weakened, by applying force for detaching the first substrate 20 from the second substrate 30, the first substrate 20 is separated from the second substrate 30. Subsequently, as shown in FIG. 7B, the release layer 21 adhering to the back surface of the device layer is removed. As the method for removing the release layer 21, for example, etching, asking, grinding, or the like may be mentioned. When the release layer 21 is removed, some portions of the temporary adhesive 31 are exposed to the air in the connecting section 13. When the temporary adhesive is exposed to the air, there is a possibility that the temporary adhesive may be swollen or deformed by absorbing the moisture in the air. Therefore, after the release layer is removed, the substrate bonding process, which will be described below (FIG. 8A), is desirably carried out promptly (preferably within 24 hours from the separation process shown in FIG. 7A). As described above, in view of suppressing swelling or deformation of the temporary adhesive 31, it is effective to decrease the ratio of the area of the connecting section 13 to the total area of the electronic device substrate 101 as much as possible so that the relationship $Li-Lf \leqq 3$ mm is satisfied.

Figure 8A:
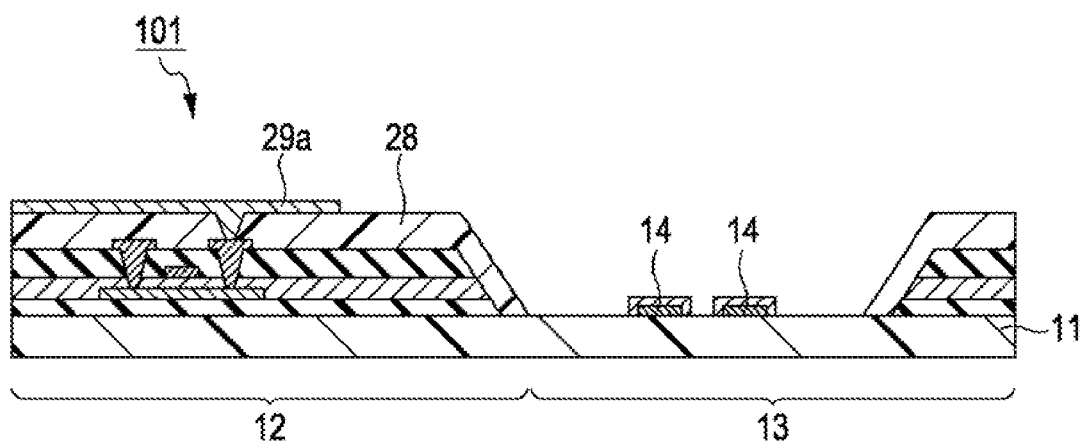
FIGS. 8A and 8B are each a cross-sectional view showing a manufacturing process of an electronic device substrate according to the first embodiment.

Next, as shown in FIG. 8A, an adhesive (not shown) is applied to the back surface of the device layer and the device layer and a substrate 11 is bonded to each other. The substrate 11 is a flexible resin substrate as described above. Subsequently, the temporary adhesive 31 and the second substrate 30 are removed. Thereby, the manufacturing process of the electronic device substrate 101 is completed.

Figure 8B:
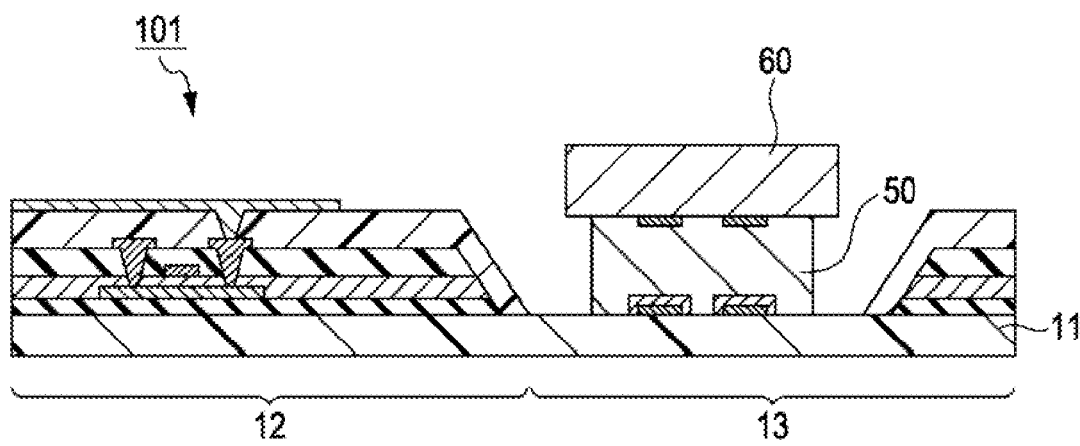

FIG. 8B shows a mounting process in which a semiconductor chip, as an external component 60 to be connected, is mounted on the electronic device substrate 101. An anisotropic conductive film 50 containing a thermosetting adhesive is applied onto the connection terminals 14, and the external component 60 to be connected is thermocompression-bonded to the connection terminals 14 to thereby connect the external component 60 to the connection terminals 14. In the thermocompression bonding process, the temperature is, for example, set at 110° C. to 150° C., and the pressure is, for example, set at 0.5 to 5 MPa. Since the inorganic insulating films are removed from the connecting section 13, when the external component 60 to be connected is thermocompression-bonded to the connection terminals 14 through the anisotropic conductive film 50, wiring (not shown) provided in the connecting section 13 is not damaged, and it is possible to effectively suppress a decrease in production yield. As described above, in accordance with this embodiment, without particularly adding a new process step, it is possible to stably mount the external component 60 to be connected under heating/pressing conditions of 110° C. to 150° C./about 0.5 to 5 MPa.

In the first embodiment, a flexible resin substrate is used as the substrate 11. It may be possible to use a flexible substrate made of metal or the like having a resin layer provided on the surface thereof, a non-flexible substrate made of metal or the like having a resin layer provided on the surface thereof, or a very soft, film-shaped resin substrate.

In the method exemplified above, the device layer (device layer including the element section 12 and the connecting section 13) formed on the first substrate 20 is transferred to the substrate 11 by irradiating the release layer 21 with light, thereby to manufacture the electronic device substrate 101. However, the embodiment is not limited thereto. As the transfer method, a method may be used in which, instead of the release layer, an etching stopper layer 21 is provided with respect to a glass layer, by etching the glass layer from back surface, the structure shown in FIG. 7A is formed, and a flexible electronic device substrate 101 is fabricated. Furthermore, a device layer may be directly formed on a flexible substrate 11. In such a case, as the resin layer, a resin layer (epoxy resin, imide resin, acrylic resin, or the like) containing a functional group having excellent adhesiveness with metal can be suitably used. This will be described in detail below in the second embodiment.

Although the anisotropic conductive film is used for connecting the external component 60 to be connected and the connection terminal 14 to each other in the example described above, anisotropic conductive paste may be used. Furthermore, although the semiconductor chip is described as an example of the external component 60 to be connected, it may also possible to mount a flexible printed-circuit board or a flexible printed-circuit board provided with a semiconductor chip, as the external component 60 to be connected, on the electronic device substrate 101. In such a case, wiring provided in the connecting section 13 is not damaged, and it is possible to effectively suppress a decrease in production yield.

Second Embodiment

A method of manufacturing an electronic device substrate 102, and a method of connecting an external component to be connected to the electronic device substrate 102 according to a second embodiment of the invention will be described with reference to FIGS. 9A to 12B, which are each a cross-sectional view of an electronic device substrate, in which the right side shows a first region 12 where thin-film elements are formed, and the left side shows a second region 13 where connection terminals are formed. In the second embodiment, a method in which a semiconductor circuit is directly formed on a flexible substrate 11 will be described.

The electronic device substrate 102 is provided with electronic elements, such as a plurality of thin-film transistors. The electronic device substrate 102 includes a substrate 11. The substrate 11 may be a resin substrate, such as a plastic film, or may be a resin layer with a thickness of several microns to about 100 microns formed on a support substrate, such as a glass substrate. The resin layer may be removed from the support substrate after electronic elements, such as thin-film transistors, have been formed, and used as a flexible substrate. The same components as those of the first embodiment are designated by the same reference numerals, and duplicate descriptions will be omitted.

Figure 9A:
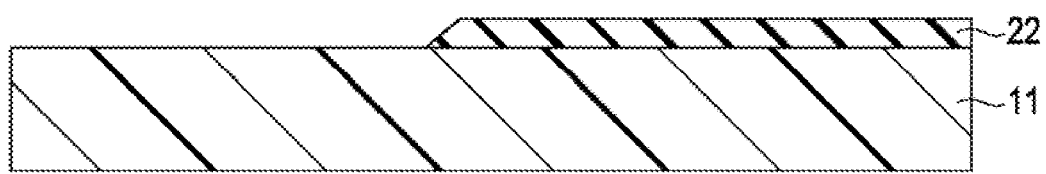
FIGS. 9A and 9B are each a cross-sectional view showing a manufacturing process of an electronic device substrate according to a second embodiment of the invention.

First, as shown in FIG. 9A, an underlying protective film 22 is deposited on the front surface of the substrate 11, and the underlying protective film 22 located in a region where a connection terminal 14 to be formed is removed. Note that the underlying protective film 22 is not absolutely necessary and may be omitted.

Figure 9B:
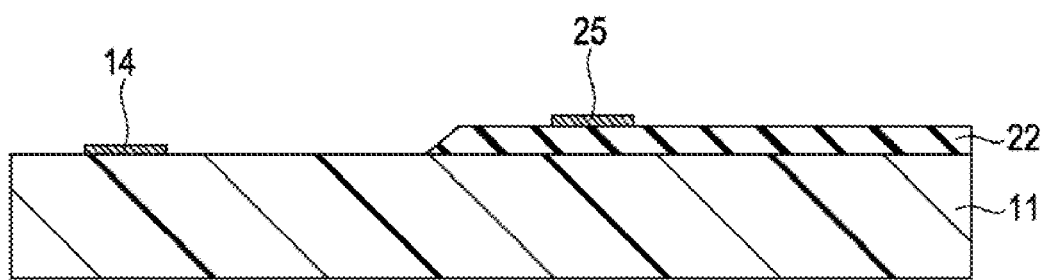

Next, as shown in FIG. 9B, a low-resistance conductive film is deposited over the entire surface of the substrate using a known thin film process, such as sputtering. By patterning the low-resistance conductive film to a desired shape, a connection terminal 14 is formed and, at the same time, a gate electrode 25 is formed on the underlying protective film 22. In such a manner, by performing formation of the connection terminal 14 and formation of the gate electrode 25 at one time simultaneously, it is possible to suppress an increase in the manufacturing process. The connection terminal 14 shown in FIG. 9B is connected to the gate electrode 25 and supplies scanning signals to the transistor element.

Figure 10A:
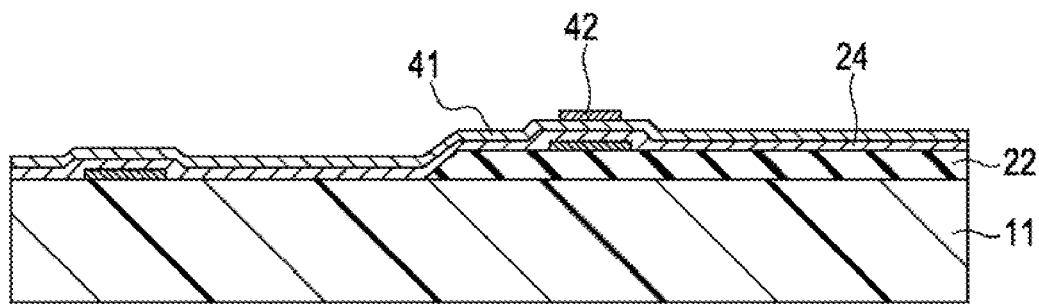
FIGS. 10A and 10B are each a cross-sectional view showing a manufacturing process of an electronic device substrate according to the second embodiment.

Next, as shown in FIG. 10A, using a known thin film process, such as plasma CVD, a gate-insulating film 24, an intrinsic semiconductor film 41, and an etching stopper 42 are deposited in that order over the entire surface of the substrate, and the etching stopper 42 is subjected to patterning. As the intrinsic semiconductor film 41, for example, intrinsic semiconductor amorphous silicon can be used. As the etching stopper 42, for example, the same material (silicon nitride or the like) as that of the gate-insulating film 24 can be used.

Figure 10B:
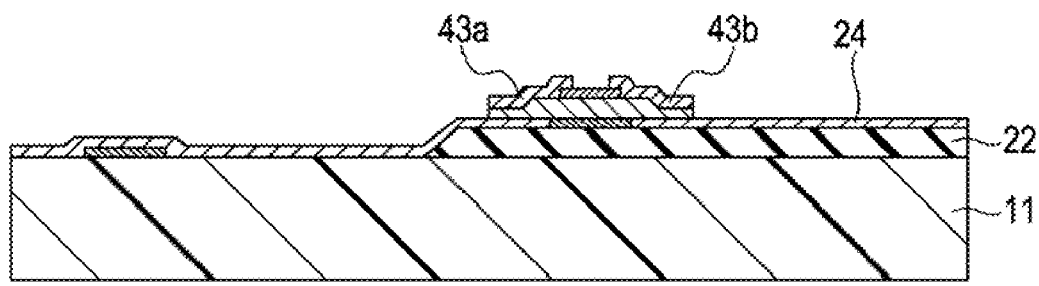

Next, as shown in FIG. 10B, using a known thin film process, such as plasma CVD, an n+ microcrystal silicon layer is formed, and by subjecting the n+ microcrystal silicon layer to patterning, ohmic contact layers 43a and 43b are formed. At this time, the intrinsic semiconductor film 41 is also patterned to a predetermined shape.

Figure 11A:
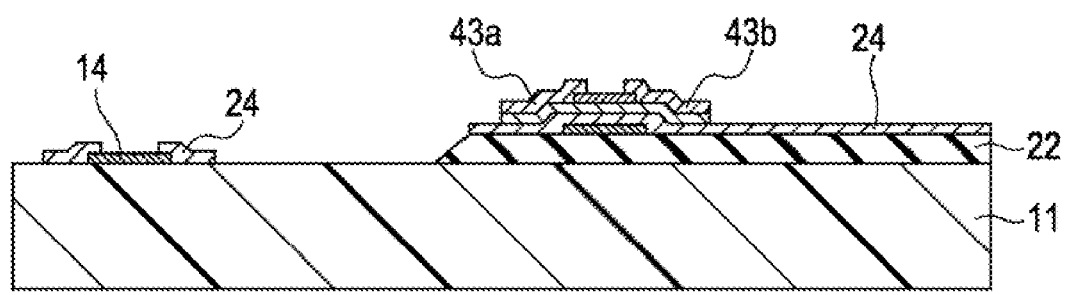
FIGS. 11A and 11B are each a cross-sectional view showing a manufacturing process of an electronic device substrate according to the second embodiment.

Next, as shown in FIG. 11A, the gate-insulating film 24 located in the region where the connection terminal 14 is provided is removed. Preferably, the gate-insulating film 24 is left so as to partially cover the exposed surface of the connection terminal 14. Thereby, the connection terminal 14 is prevented from being detached from the substrate 11.

Figure 11B:
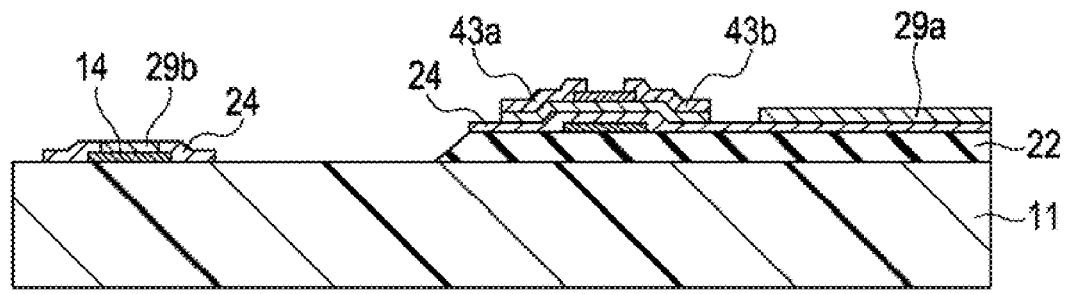
Figure 12A:
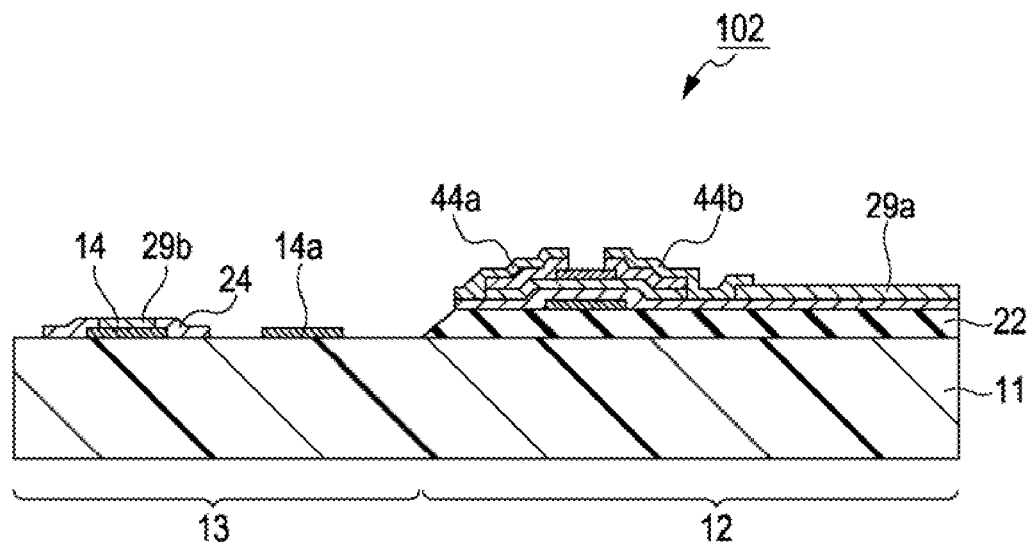
FIGS. 12A and 12B are each a cross-sectional view showing a manufacturing process of an electronic device substrate according to the second embodiment.

In the case where the electronic device substrate 102 is, for example, used as a liquid crystal display device, next, as shown in FIG. 11B, a transparent electrode material is deposited over the entire surface of the substrate, and by patterning the resulting transparent electrode material layer to a predetermined shape, a pixel electrode 29a is formed. Preferably, the exposed surface of the connection terminal 14 is covered with a transparent electrode material 29b so that the connection terminal 14 is protected. Subsequently, as shown in FIG. 12A, using a known thin film process, such as sputtering, a low-resistance conductive film is deposited. By patterning the low-resistance conductive film to a predetermined shape, a drain electrode 44b that is connected to the pixel electrode 29a and the ohmic contact layer 43b, a source electrode 44a that is connected to the ohmic contact layer 43a, and a connection terminal 14a that supplies image signals to the source electrode 44a are formed. Thereby, the manufacturing process of the electronic device substrate 102 is completed.

Figure 12B:
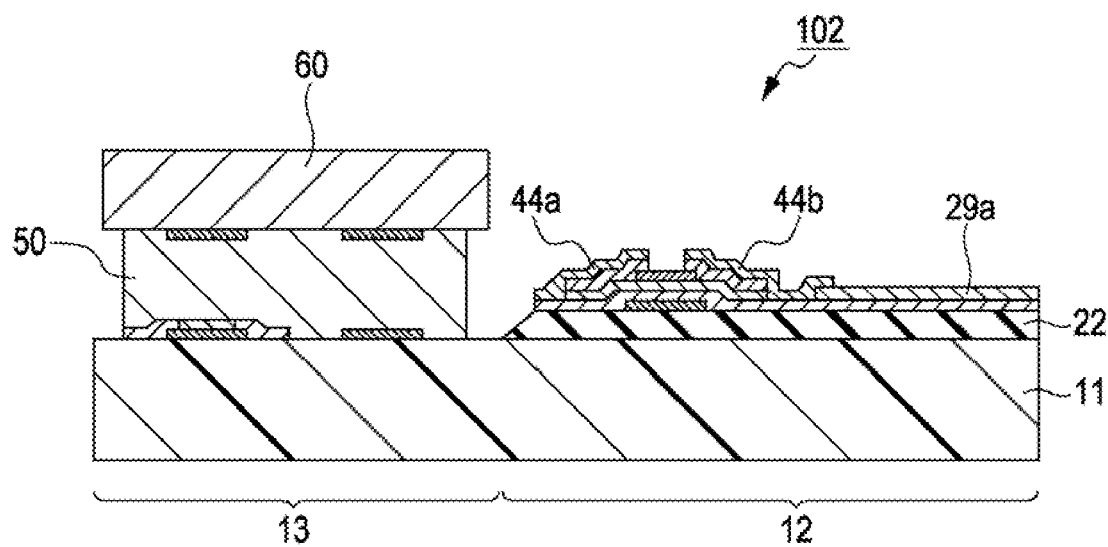

FIG. 12B shows a mounting process in which an external component 60 to be connected is mounted on the electronic device substrate 102. An anisotropic conductive film 50 containing a thermosetting adhesive is applied onto the connection terminals 14 and 14a, and the external component 60 to be connected is thermocompression-bonded to the connection terminals 14 and 14a to thereby connect the external component 60 to the connection terminals 14 and 14a. In accordance with the embodiment of the invention, when the external component 60 to be connected is thermocompression-bonded to the connection terminals 14 through the anisotropic conductive film, even if the resin substrate or the resin layer underlying the connection terminals 14 is deformed by pressure, since inorganic insulating films are not provided at least in a region which in plan view overlaps with the connection terminals, wiring (not shown) provided on the substrate 11 is not damaged, and it is possible to effectively suppress a decrease in production yield.

In the example described above, the connection terminal 14 connected to the gate electrode 25 and the connection terminal 14a that supplies image signals to the source electrode 44a are disposed in one place as shown in FIG. 1. However, a connecting section 13 may be provided, for example, at each of two adjacent ends among a plurality of ends of the electronic device substrate 102, connecting terminals 14 may be collectively arranged in one of the connecting sections, and connecting terminals 14a may be collectively arranged in the other connecting section. Furthermore, a plurality of connecting sections 13 may be provided at one end.

When a plurality of connecting sections 13 are provided in the electronic device substrate 102, inorganic insulating films are not provided in each of the plurality of connecting sections 13. However, it is preferable to provide inorganic insulating films in the region between two adjacent connecting sections 13. By providing inorganic insulating films in the region between two adjacent connecting sections 13, the substrate 11 is prevented from being bent more than necessary, and the inorganic insulating films provided in the element section 12 are prevented from being easily detached, thus being advantageous.

Third Embodiment

In a third embodiment, the electronic device substrate 10 according to the embodiment of the invention is used as a substrate for a fingerprint sensor. In this embodiment, as in the first embodiment, the electronic device substrate 10 includes a substrate 11 and a device layer provided on the substrate 11. In the first region of the device layer, a sensor electrode, a transistor, and the like for detecting electrostatic capacitance between a contact finger and the circuit are provided. In the second region, connection terminals 14 used for connection to an external component to be connected (e.g., a driver IC or a flexible printed-circuit board) are provided. The third embodiment differs from the first embodiment in that a non-flexible metal substrate having a resin layer on the surface thereof is used as the substrate 11. The metal substrate can be considered as a supporting layer for the resin layer.

Figure 13:
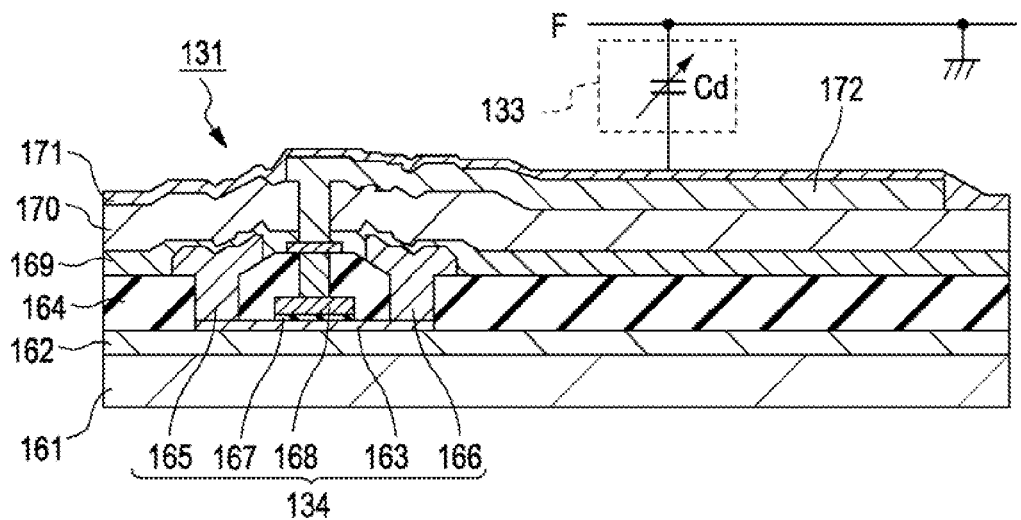
FIG. 13 is a cross-sectional view showing a manufacturing process of an electronic device substrate according to a third embodiment of the invention.

FIG. 13 is a cross-sectional view of an electrostatic capacitance-detecting circuit including a sensor electrode. As shown in FIG. 13, an electrostatic capacitance-detecting circuit 131 includes a signal-amplifying transistor 134 that outputs a detection signal carrying information on a fingerprint pattern and a sensor electrode 172 that forms an electrostatic capacitor 133 between a finger F of the subject and the circuit. The signal-amplifying transistor 134 is a transistor constituted by a gate electrode 168, a gate-insulating film 167, a polycrystalline silicon layer (active layer) 163, a source electrode 165, and a drain electrode 166. The electrostatic capacitor 133 is a variable capacitor whose capacitance varies depending on the fingerprint pattern. The potential of the finger F is set at a reference potential. The sensor electrode 172 is connected to the gate electrode 168. The circuit is configured so that a change in detection capacitance Cd due to the fingerprint pattern is transmitted to the signal-amplifying transistor 134, and the change in electrostatic capacitance can be sensed by amplification of a drain current flowing through the channel.

In the electronic device substrate 10 according to this embodiment, the transistor provided in the element section 12 includes a semiconductor film, electrodes (a gate electrode, a drain electrode, and a source electrode), and insulating films (a gate-insulating film, an interlayer insulating film, and the like). In the connecting section 13, inorganic insulating films are not provided. That is, the insulating films provided in the element section 12 may be all inorganic insulating films, or some of them may be organic insulating films. However, inorganic insulating films, which may be damaged at the time of thermocompression bonding of an external component to be connected to the connecting section 13 through an anisotropic conductive film containing a thermosetting adhesive or the like, are not disposed at least in a region which in plan view overlaps with the plurality of connection terminals 14. In other words, the plurality of connection terminals 14 do not overlap with any of the inorganic insulating films.

In the manufacturing process of the electronic device substrate 10, inorganic insulating films may also be formed in the connecting section 13 on the substrate 11. However, the inorganic insulating films disposed at least in a region where a plurality of connection terminals 14 are to be formed are removed before the formation of the plurality of connection terminals 14. In accordance with this embodiment of the invention, since no inorganic insulating films are disposed at least in a region which in plan view overlaps with the plurality of connection terminals 14, even if the resin layer underlying the connection terminals 14 is deformed by pressure at the time of thermocompression bonding of the external component to be connected to the plurality of connection terminals 14, wiring (not shown) provided on the resin layer (substrate 11) is not damaged, and it is possible to efficiently suppress a decrease in production yield.

As described above, the external component to be connected is a driver IC, a flexible printed-circuit board, or the like. The driver IC or the flexible printed-circuit board has connecting electrodes to be connected to the connection terminals 14. The highest pressure is applied to the substrate 11 in the region where the connection terminals 14 and the connecting electrodes overlap with each other with an anisotropic conductive film therebetween. Consequently, if at least the connection terminals 14 in plan view do not overlap with any of the inorganic insulating films, an advantage can be obtained in that a decrease in production yield can be suppressed.

The electronic device substrate 10 according to this embodiment can also be manufactured by the same manufacturing method as that described in the first embodiment. Therefore, the manufacturing method is omitted.

Fourth Embodiment

In a fourth embodiment, the electronic device substrate 10 according to the embodiment of the invention is used as a substrate for an electrophoretic display device. In this embodiment, as in the first embodiment, the electronic device substrate 10 includes a substrate 11 and a device layer provided on the substrate 11. As in the first embodiment, as the substrate 11, a flexible resin substrate is used. The thickness of the resin substrate is about 100 μm. In the first region of the device layer, circuit elements for displaying an image by controlling the distribution of particles contained in the electrophoretic device are provided. Examples of the circuit elements include transistors, pixel electrodes, and the like. In the second region, a plurality of connection terminals 14 used for connection to an external component to be connected (e.g., a driver IC or a flexible printed-circuit board) are provided.

Figure 14:
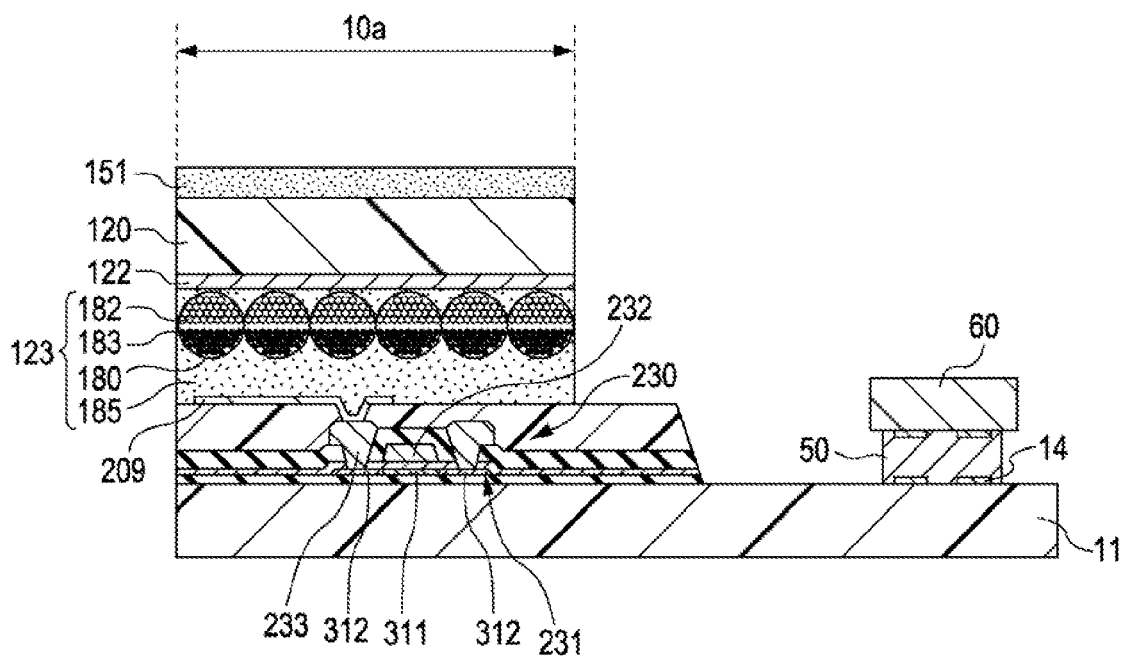
FIG. 14 is a cross-sectional view showing a manufacturing process of an electronic device substrate according to a fourth embodiment of the invention.

FIG. 14 is a partial cross-sectional view of an electrophoretic display device in which the electronic device substrate 10 according to the embodiment of the invention is used as a substrate 11 for an electrophoretic display device. As shown in FIG. 14, the electrophoretic display device includes the substrate 11 for an electrophoretic display device, a counter substrate 120 provided with a counter electrode 122, and an electrophoretic layer 123 interposed therebetween.

In the electronic device substrate 10 according to this embodiment, the transistor provided in the element section 12 includes a semiconductor film, electrodes (a gate electrode, a drain electrode, and a source electrode), and insulating films (a gate-insulating film, an interlayer insulating film, and the like). In the connecting section 13, inorganic insulating films are not provided as in the first embodiment. That is, the insulating films provided in the element section 12 may be all inorganic insulating films, or some of them may be organic insulating films. However, inorganic insulating films, which may be damaged at the time of thermocompression bonding of an external component to be connected to the connecting section 13 through an anisotropic conductive film containing a thermosetting adhesive or the like, are not disposed at least in a region which in plan view overlaps with the plurality of connection terminals 14. In other words, the plurality of connection terminals 14 do not overlap with any of the inorganic insulating films.

In FIG. 14, reference numeral 10a represents a display area, reference numeral 151 represents an adhesion layer for bonding the counter substrate 120 to a protective substrate (not shown), reference numeral 122 represents a common electrode, reference numeral 123 represents an electrophoretic layer, reference numeral 182 represents a white particle (electrophoretic particle), reference numeral 183 represents a black particle (electrophoretic particle), reference numeral 180 a microcapsule, reference numeral 185 represents a binder, reference numeral 209 represents a pixel electrode, reference numeral 230 represents a TFT, reference numeral 232 represents a gate electrode, reference numeral 233 represents a source/drain electrode, reference numeral 311 represents a channel region, reference numeral 312 represents a source/drain region, reference numeral 231 represents a semiconductor layer, reference numerals 241 and 242 represent interlayer insulating films, reference numeral 202 represents a gate-insulating film, and reference numeral 205 represents an insulating film.

Next, with reference to FIGS. 15A and 15B, a method of manufacturing an electronic device substrate 10 according to the fourth embodiment will be described. The manufacturing method is the same as that of the first embodiment up to the transfer of the device layer formed on the first substrate 20 to the second substrate 30. Consequently, description will be made from the process step following the step of removing the release layer 21 from the device layer which has been transferred to the second substrate 30 (refer to FIG. 7B).

Figure 15A:
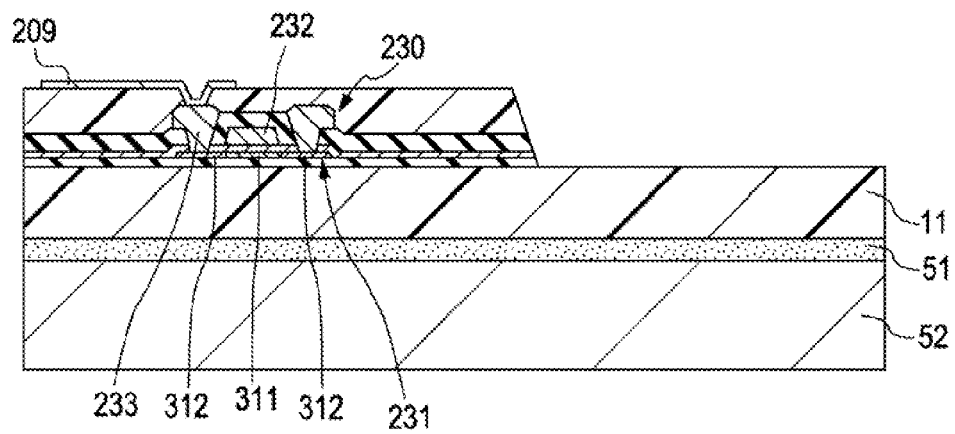
FIGS. 15A and 15B are each a cross-sectional view showing a manufacturing process of an electronic device substrate according to the fourth embodiment.

As shown in FIG. 15A, an adhesive (not shown) is applied to the back surface of the device layer, and the device layer and the substrate 11 are bonded to each other. In this embodiment, the substrate 11 is attached to the support substrate 52 with an adhesive layer 51 therebetween. Then, the temporary adhesive 31 and the second substrate 30 are removed.

Figure 15B:
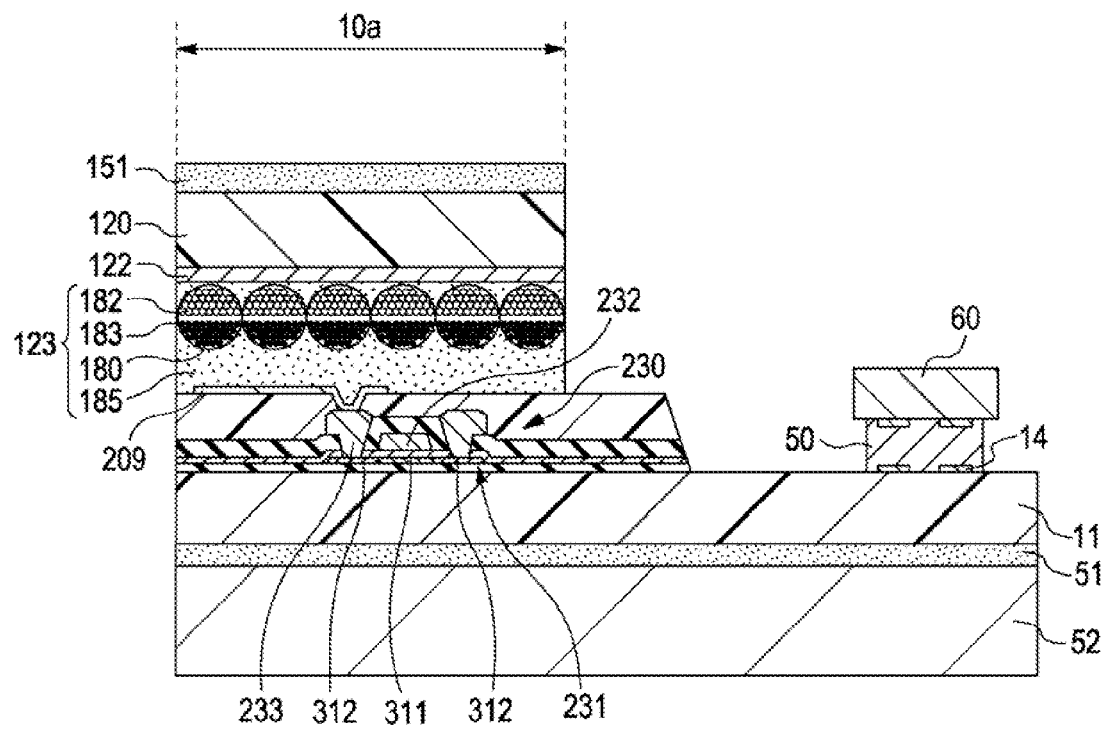

Next, as shown in FIG. 15B, the electrophoretic layer 123 is interposed between the substrate 11 and the counter substrate 120. Then, a semiconductor chip, as the external component 60 to be connected, is mounted on the substrate 11 for an electrophoretic display device. Finally, the substrate 11 is separated from the support substrate 52. Thereby, the manufacturing process of the electrophoretic display device is completed.

In accordance with this embodiment of the invention, since no inorganic insulating films are disposed at least in a region which in plan view overlaps with the plurality of connection terminals 14, even if the resin layer (substrate 11) underlying the connection terminals 14 is deformed by pressure at the time of thermocompression bonding of the external component to be connected to the plurality of connection terminals 14 with an anisotropic conductive film therebetween, wiring (not shown) provided on the resin layer (substrate 11) is not damaged, and it is possible to efficiently suppress a decrease in production yield.

Fifth Embodiment

In the fourth embodiment, a flexible resin substrate with a thickness of about 100 µm is used as the substrate 11, while in a fifth embodiment, a film-shaped resin layer with a thickness of about 10 µm is used as the substrate 11. The fifth embodiment differs from the fourth embodiment only in the thickness of the substrate 11 and the manufacturing method. Therefore, the manufacturing method will be described.

In the fourth embodiment, the substrate to which the device layer is finally transferred is the flexible resin substrate (substrate 11) attached to the support substrate 52. In this embodiment, the device layer is directly formed on a film-shaped substrate 11 with a thickness of 10 µm fixed on a support substrate 52. In this case, after an adhesive layer 51 is formed, by a spin-coating method or the like, on the support substrate 52, the film-shaped substrate 11 is fixed. By undergoing the same process steps as those shown in FIGS. 3A to 6B and FIG. 15B, a very thin electrophoretic display device is fabricated.

That is, the device layer is formed on the film-shaped substrate 11 fixed on the support substrate 52. Next, an electrophoretic layer 123 is interposed between the substrate 11 and a counter substrate 120. Then, a semiconductor chip, as an external component 60 to be connected, is mounted on the substrate 11 for an electrophoretic display device. Finally, the support substrate 52 is separated from the film-shaped substrate 11. Thereby, the manufacturing process of a very thin electrophoretic display device is completed.

In accordance with this embodiment of the invention, since no inorganic insulating films are disposed at least in a region which in plan view overlaps with the plurality of connection terminals 14, even if the resin layer (substrate 11) underlying the connection terminals 14 is deformed by pressure at the time of thermocompression bonding of the external component to be connected to the plurality of connection terminals 14 with an anisotropic conductive film therebetween, wiring (not shown) provided on the resin layer (substrate 11) is not damaged, and it is possible to efficiently suppress a decrease in production yield.

The electronic device substrate 10 according to the embodiments of the invention have been described using the liquid crystal display device, the electrophoretic display device, and the fingerprint sensor. The electronic device substrate 10 can also be applied to display device substrates for organic EL devices, inorganic EL devices, and plasma display devices, and substrates for an electronic circuit, such as an arithmetic unit (CPU) and a memory. In short, when at least connection terminals 14 in plan view do not overlap with the inorganic insulating films provided in the element section 12, even if the resin layer underlying the connection terminals 14 is deformed by pressure at the time of thermocompression bonding of the external component to be connected to the connecting section 13, wiring provided on the resin layer (substrate 11) is not damaged, and it is possible to efficiently suppress a decrease in production yield.

Sixth Embodiment

Figure 16A:
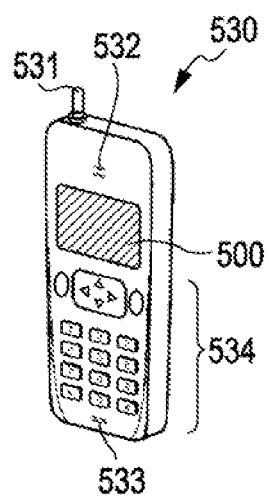
FIGS. 16A to 16D are each an illustrative view of an electronic apparatus according to a sixth embodiment of the invention.
Figure 16B:
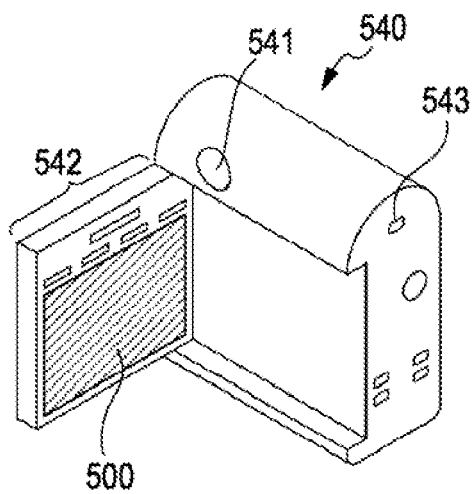
Figure 16C:
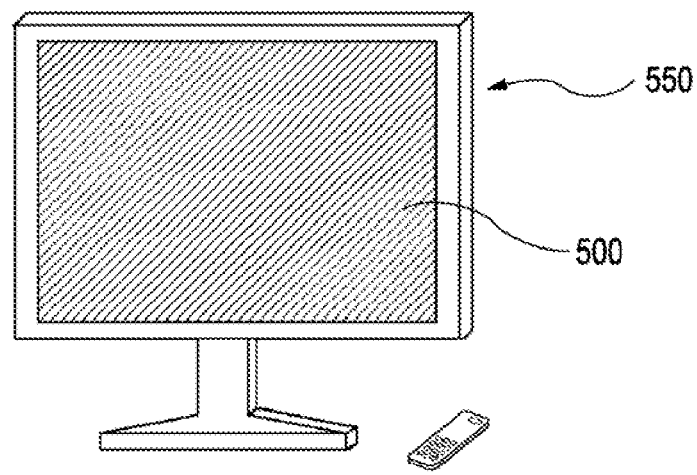
Figure 16D:
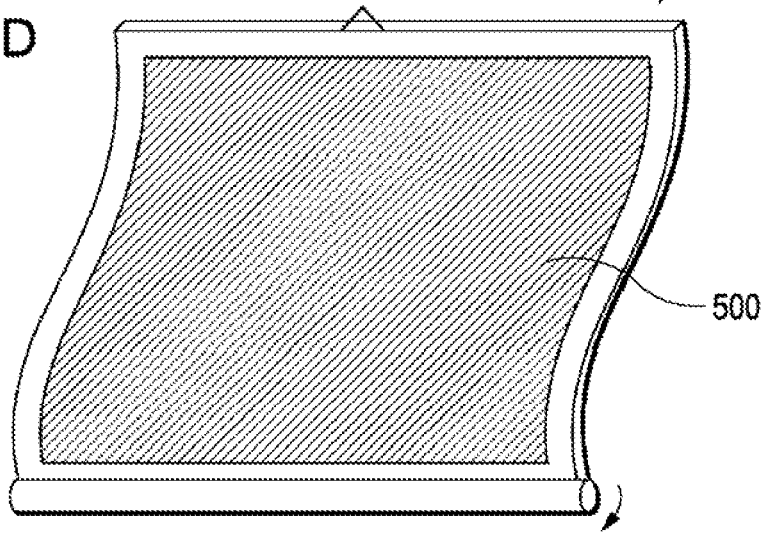

Next, specific examples of an electronic apparatus according to an embodiment of the invention will be described. FIGS. 16A to 16D show, as specific examples of the electronic apparatus, a cellular phone 530, a video camera 540, a television 550, and a roll-up television 560. As shown in FIG. 16A, the cellular phone 530 includes an antenna portion 531, a voice output portion 532, a voice input portion 533, an operating portion 534, and an electro-optical device (display portion) 500. As shown in FIG. 16B, the video camera 540 includes an image reception portion 541, an operating portion 542, a voice input portion 543, and electro-optical device (display portion) 500. As shown in FIG. 16C, the television 550 includes an electro-optical device (display portion) 500. The invention can also be applied to a monitor device (electro-optical device) used in a personal computer and the like. As shown in FIG. 16D, the roll-up television 560 includes an electro-optical device (display portion) 500. The electro-optical device (display portion) 500 described above includes an electronic device substrate 10 according to any of the embodiments of the invention. Examples of the electro-optical device provided with the electronic device substrate 10 include, in addition to a liquid crystal display device and an electrophoretic display device, an organic EL device, an inorganic EL device, and a plasma display device.

Figure 17:
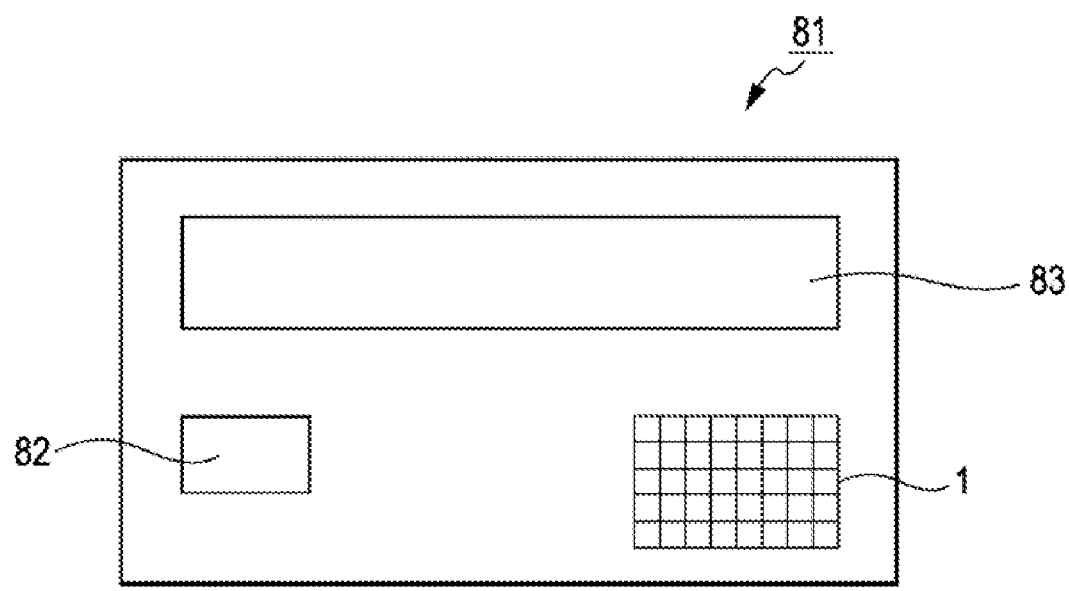
FIG. 17 is an illustrative view of an electronic apparatus according to the sixth embodiment.

FIG. 17 shows a smart card 81 on which a fingerprint sensor provided with an electronic device substrate 10 according to the embodiment of the invention is mounted. The smart card 81 includes a fingerprint sensor 1, an IC chip 82 on which a CPU, a memory element, and the like are mounted, and a display device 83, such as a liquid crystal display device. Fingerprint information of the card owner, as biometrics information, is registered in the IC chip 82. By comparing the fingerprint detected by the fingerprint sensor with the registered fingerprint, identification is verified. The invention is also applied to such an electronic device.

Other examples of the electronic apparatus according to this embodiment include a facsimile device with a display function, a finder of a digital camera, a portable TV, an electronic notebook, an electric bulletin board, and a display for advertisement.

The embodiments described above can be appropriately combined, modified, or improved depending on the intended use. It is to be understood that the invention is not limited to the embodiments described above.

What is claimed is:

1. An electronic device substrate comprising:
    a resin layer;
    a semiconductor layer disposed in a first region on the resin layer;
    a plurality of insulating films disposed in the first region on the resin layer; and
    connection terminals disposed in a second region on the resin layer, the connection terminals being used for connection to an external component to be connected,
    wherein the connection terminals in plan view do not overlap with any insulating films composed of an inorganic material among the plurality of insulating films.

2. An electronic device comprising:
    the electronic device substrate according to claim 1; and
    an external component to be connected which has been connected to the connection terminals through a thermosetting adhesive.

3. A method of manufacturing an electronic device substrate, the electronic device substrate including a resin layer, a semiconductor layer disposed in a first region on the resin layer, a plurality of insulating films disposed in the first region on the resin layer, and connection terminals disposed in a second region on the resin layer, the connection terminals being used for connection to an external component to be connected, the method comprising:
    forming the semiconductor layer and the plurality of insulating films in the first region on the resin layer; and
    forming the connection terminals in the second region on the resin layer such that the connection terminals in plan view do not overlap with any insulating films composed of an inorganic material among the plurality of insulating films.

4. A method of manufacturing an electronic device, the electronic device including an electronic device substrate manufactured by the method of manufacturing an electronic device substrate according to claim 3 and an external component to be connected, the method further comprising connecting the external component to be connected to the connection terminals through a thermosetting adhesive.

* * * * *